(12) United States Patent
Lee et al.

(10) Patent No.: US 9,960,112 B2
(45) Date of Patent: May 1, 2018

(54) SEMICONDUCTOR DEVICE (71) Applicant: Samsung Electronics Co., Ltd., Suwon-si, Gyeonggi-do (KR)

(72) Inventors: Chanho Lee, Gwangmyeong-si (KR); Hyunsoo Chung, Hwaseong-si (KR); Myeong Soon Park, Goyang-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days. days.

(21) Appl. No.: 15/259,024

(22) Filed: Sep. 7, 2016

(65) Prior Publication Data

US 2017/0162500 A1 Jun. 8, 2017

(30) Foreign Application Priority Data

Dec. 3, 2015 (KR) ........................ 10-2015-0171647

(51) Int. Cl.
*H01L 23/522* (2006.01)
*H01L 23/498* (2006.01)
*H01L 23/00* (2006.01)

(52) U.S. Cl.
CPC .... *H01L 23/5223* (2013.01); *H01L 23/49816* (2013.01); *H01L 24/14* (2013.01); *H01L 2224/1403* (2013.01)

(58) Field of Classification Search
CPC  H01L 23/5223; H01L 23/49816; H01L 24/14
See application file for complete search history.

(56) References Cited

U.S. PATENT DOCUMENTS

| 7,339,256 | B2 | 3/2008 | Nakamura et al. | |
|---|---|---|---|---|
| 7,544,522 | B2 | 6/2009 | Kanda et al. | |
| 7,741,714 | B2 | 6/2010 | Huang et al. | |
| 7,745,939 | B2 | 6/2010 | Sunohara et al. | |
| 8,310,056 | B2 | 11/2012 | Oda et al. | |
| 8,525,317 | B1* | 9/2013 | Sutardja | H01L 23/3675 257/685 |
| 8,748,305 | B2 | 6/2014 | Chen | |
| 2005/0167842 | A1 | 8/2005 | Nakamura et al. | |
| 2006/0091536 | A1 | 5/2006 | Huang et al. | |
| 2007/0045746 | A1 | 3/2007 | Sunohara et al. | |
| 2007/0231936 | A1 | 10/2007 | Kanda et al. | |
| 2010/0301488 | A1 | 12/2010 | Oda et al. | |
| 2011/0115073 | A1 | 5/2011 | Chen | |
| 2013/0223014 | A1* | 8/2013 | Lin | B23K 1/0016 361/728 |
| 2014/0264739 | A1 | 9/2014 | Morrow et al. | |
| 2015/0221714 | A1* | 8/2015 | Gu | H01L 23/5223 257/532 |
| 2016/0379921 | A1* | 12/2016 | Shin | H01L 23/49838 257/676 |

\* cited by examiner

*Primary Examiner* — Long Pham
(74) *Attorney, Agent, or Firm* — Renaissance IP Law Group LLP

(57) ABSTRACT

A semiconductor device comprising: a substrate; a decoupling capacitor disposed on the substrate; a first connection pad vertically overlapping with the decoupling capacitor; a passivation layer exposing a portion of the first connection pad; and a first solder bump disposed on the first connection pad and covering a portion of a top surface of the passivation layer.

19 Claims, 7 Drawing Sheets

SEMICONDUCTOR DEVICE

CROSS-REFERENCE TO RELATED APPLICATION

This U.S. non-provisional patent application claims priority under 35 U.S.C. § 119 to Korean Patent Application No. 10-2015-0171647, filed on Dec. 3, 2015, in the Korean Intellectual Property Office, the disclosure of which is hereby incorporated by reference in its entirety.

BACKGROUND

Embodiments relate to a semiconductor device and, more particularly, to a semiconductor device including a solder bump vertically overlapping with an integrated circuit.

As the integration density of semiconductor devices increases, high-capacity and high-speed semiconductor devices are being demanded.

The number of operating circuits of the semiconductor device may increase in proportion to the integration density of the semiconductor device. In this case, fluctuation noise may occur in a power voltage and a ground voltage during a read operation and a write operation of the semiconductor device. To solve this problem, a semiconductor device may include a power decoupling capacitor for filtering noise existing in operating voltages such as the power voltage and the ground voltage.

SUMMARY

Embodiments include a semiconductor device comprising: a substrate; a decoupling capacitor disposed on the substrate; a first connection pad vertically overlapping with the decoupling capacitor; a passivation layer exposing a portion of the first connection pad; and a first solder bump disposed on the first connection pad and covering a portion of a top surface of the passivation layer.

Embodiments include a semiconductor device comprising: a substrate; a decoupling capacitor disposed on the substrate; a first solder bump vertically overlapping with the decoupling capacitor; and a second solder bump offset from the decoupling capacitor; wherein a width of the first solder bump is greater than a width of the second solder bump.

Embodiments include a semiconductor package, comprising: a package substrate; a semiconductor chip including a decoupling capacitor and a passivation layer; a plurality of solder bumps electrically connecting the semiconductor chip to the package substrate; wherein: a first solder bump of the solder bumps is vertically aligned with the decoupling capacitor and extends over the passivation layer; and a second solder bump of the solder bumps is spaced apart from the passivation layer.

BRIEF DESCRIPTION OF THE DRAWINGS

Embodiments will become more apparent in view of the attached drawings and accompanying detailed description.

DETAILED DESCRIPTION OF THE EMBODIMENTS

Embodiments will now be described more fully hereinafter with reference to the accompanying drawings, in which particular embodiments are shown.

Figure 1:
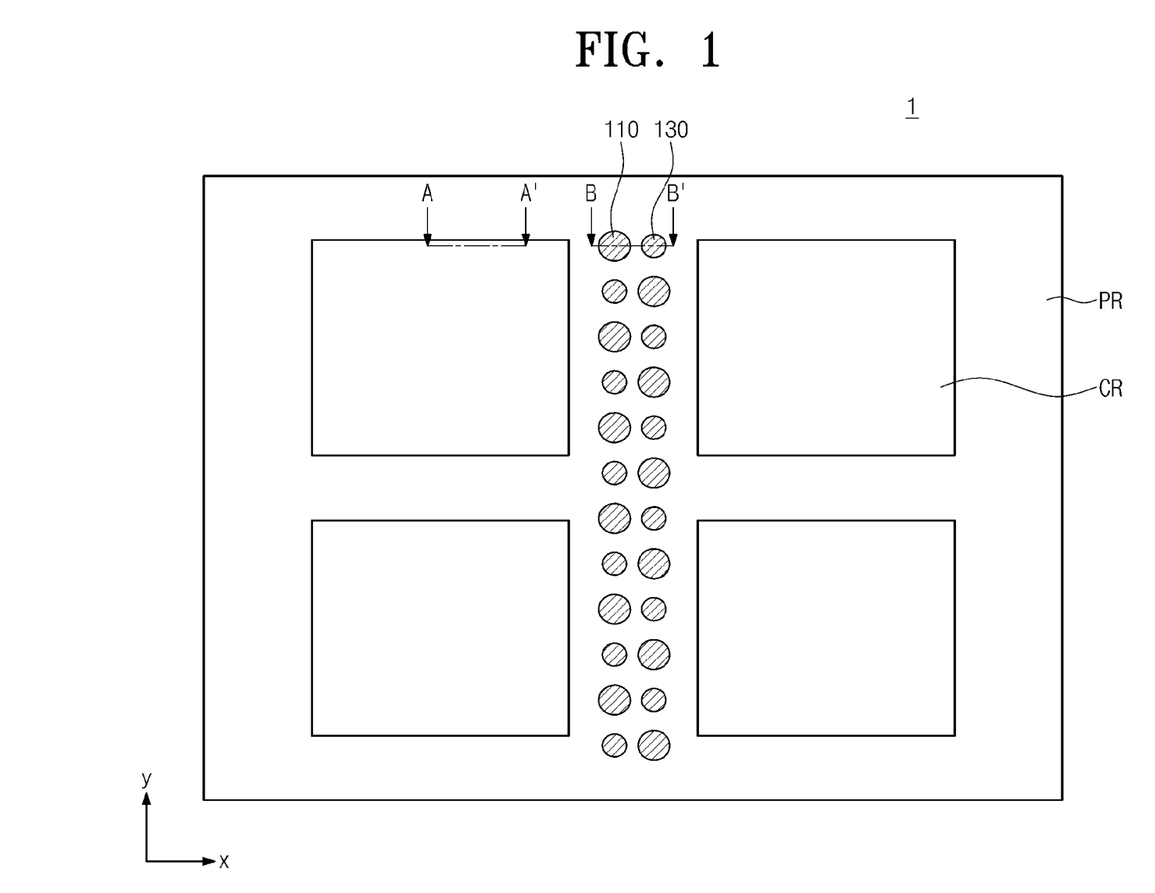
FIG. 1 is a plan view illustrating a semiconductor device according to some embodiments.

FIG. 1 is a plan view illustrating a semiconductor device according to some embodiments. Referring to FIG. 1, a semiconductor device 1 may include a cell region CR and a peripheral circuit region PR. Memory cells may be disposed in the cell region CR. A word line driver, a sense amplifier, row and column decoders, and control circuits may be disposed in the peripheral circuit region PR. In some embodiments, the cell region CR may include dynamic random access memory (DRAM) cells, static random access memory (SRAM) cells, flash memory cells, phase-change random access memory (PRAM) cells, resistive random access memory (ReRAM) cells, ferroelectric random access memory (FeRAM) cells, or magnetic random access memory (MRAM) cells. In certain embodiments, the cell region CR may include memory cells embedded in a logic circuit such as an application specific integrated circuit (ASIC), a graphic processing unit (GPU), or a central processing unit (CPU).

Solder bumps 110 and 130 may be disposed in the peripheral circuit region PR. The solder bumps 110 and 130 may include a first solder bump 110 and a second solder bump 130. The first solder bump 110 and the second solder bump 130 may be disposed in a central region of the peripheral circuit region PR. The first solder bump 110 and the second solder bump 130 may be spaced apart from each other in a first direction x. The first solder bump 110 may be provided in plurality and the second solder bump 130 may be provided in plurality. The first solder bumps 110 and the second solder bumps 130 may be arranged along a second direction y perpendicular to the first direction x to constitute a plurality of columns parallel to the second direction y. However, embodiments are not limited to this arrangement of the first solder bumps 110 and the second solder bumps 130.

Figure 2:
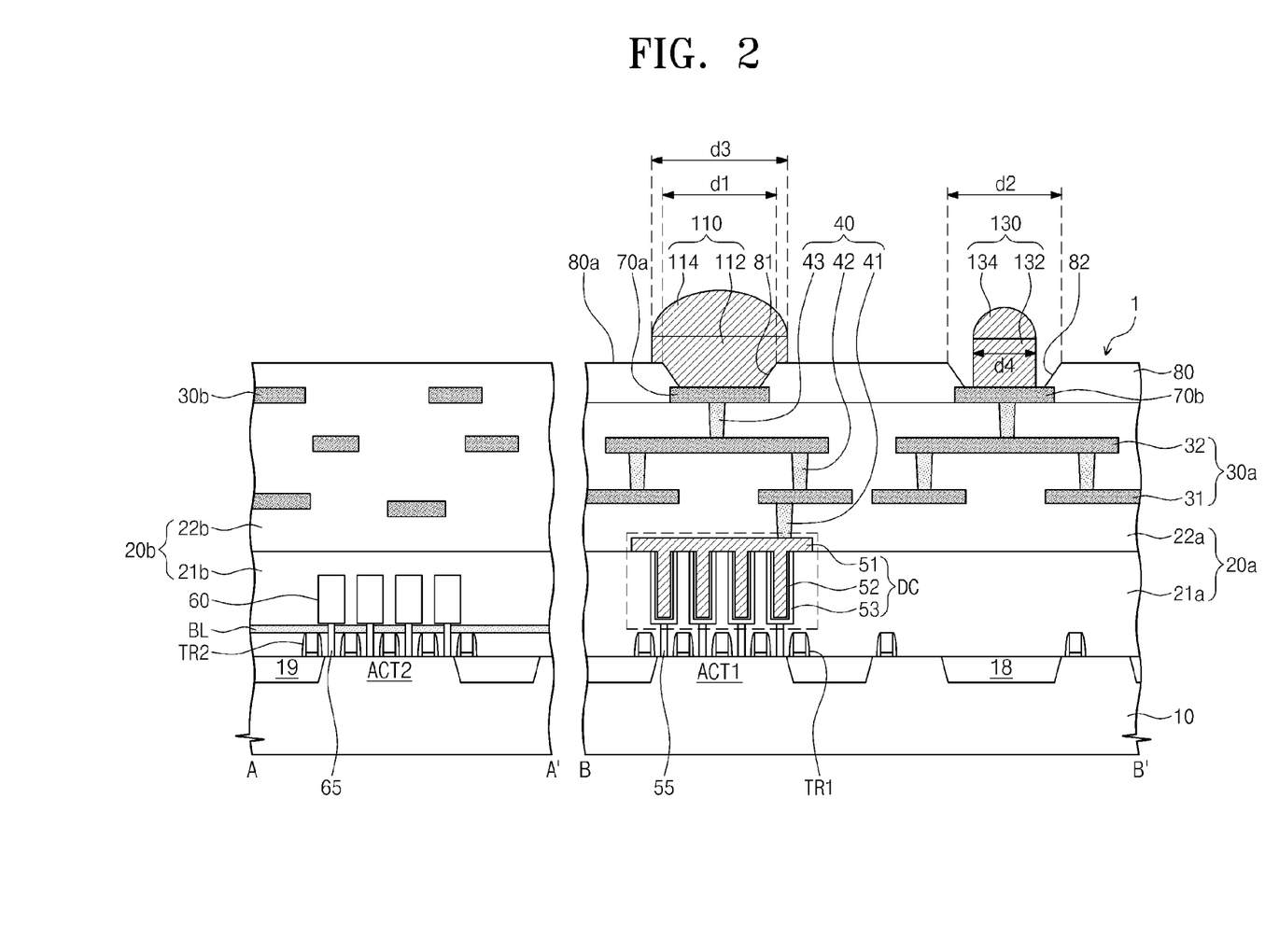
FIG. 2 is a cross-sectional view taken along lines A-A' and B-B' of FIG. 1.

FIG. 2 is a cross-sectional view taken along lines A-A' and B-B' of FIG. 1. Referring to FIGS. 1 and 2, the semiconductor device 1 may include a substrate 10, interlayer insulating layers 20a and 20b, metal interconnections 30a and 30b, a via 40, a decoupling capacitor DC, connection pads 70a and 70b, a passivation layer 80, and the solder bumps 110 and 130. The peripheral circuit region PR and the cell region CR will be described together to describe the semiconductor device 1 in detail.

The substrate 10 may include a first active region ACT1 defined by a first device isolation layer 18 and a second active region ACT2 defined by a second device isolation layer 19. The first device isolation layer 18 and the first active region ACT1 may be provided in the peripheral circuit region PR, and the second device isolation layer 19 and the second active region ACT2 may be provided in the cell region CR. Source/drain regions (not shown) may be provided in the first active region ACT1 and the second active region ACT2. The substrate 10 may be a bulk silicon substrate, a silicon-on-insulator (SOI) substrate, a germanium substrate, a germanium-on-insulator (GOI) substrate, a silicon-germanium substrate, a substrate having an epitaxial thin layer obtained by performing a selective epitaxial growth (SEG) process, or the like.

At least one first transistor TR1 and at least one second transistor TR2 may be disposed on the substrate 10. The first transistor TR1 may be provided in the peripheral circuit region PR, and the second transistor TR2 may be provided in the cell region CR. The first transistor TR1 may be a switching element included in the control circuits provided in the peripheral circuit region PR, and the second transistor TR2 may be a switching element included in the memory cell provided in the cell region CR.

A first interlayer insulating layer 20a and a second interlayer insulating layer 20b may be provided on the substrate 10. The first interlayer insulating layer 20a may be provided in the peripheral circuit region PR. The first interlayer insulating layer 20a may include a first lower interlayer insulating layer 21a and a first upper interlayer insulating layer 22a which are sequentially stacked on the substrate 10. The second interlayer insulating layer 20b may be provided in the cell region CR. The second interlayer insulating layer 20b may include a second lower interlayer insulating layer 21b and a second upper interlayer insulating layer 22b which are sequentially stacked on the substrate 10. Each of the first and second interlayer insulating layers 20a and 20b may include a silicon oxide layer, a silicon nitride layer, a silicon oxynitride layer, or the like. In addition, the first lower interlayer insulating layer 21a, the first upper interlayer insulating layer 22a, the second lower interlayer insulating layer 21b, and the second upper interlayer insulating layer 22b may be formed of the same or different materials.

A first metal interconnection 30a may be provided in the first upper interlayer insulating layer 22a, and a second metal interconnection 30b may be provided in the second upper interlayer insulating layer 22b. The first metal interconnection 30a may include at least one first lower metal interconnection 31 and at least one first upper metal interconnection 32. The first lower metal interconnection 31 and the first upper metal interconnection 32 may be configured to transmit a power voltage and/or data, which may be provided from an external system, to the cell region CR. The first metal interconnection 30a and the second metal interconnection 30b may include at least one of gold (Au), aluminum (Al), chromium (Cr), nickel (Ni), tungsten (W), titanium (Ti), tantalum (Ta), titanium-tungsten (TiW), nickel-chromium (NiCr), aluminum nitride ($AlN_x$), titanium nitride ($TiN_x$), titanium-aluminum nitride ($TiAl_xN_y$), tantalum nitride ($TaN_x$), tungsten silicide ($WSi_x$), titanium silicide ($TiSi_x$), cobalt silicide ($CoSi_x$), any alloy thereof, or the like.

The via 40 may be configured to electrically connect the first metal interconnection 30a, the decoupling capacitor DC, and the connection pads 70a and 70b to each other. The via 40 may include a first via 41 connecting the decoupling capacitor DC to one of the first lower metal interconnections 31, a second via 42 connecting the first lower metal interconnection 31 to the first upper metal interconnection 32, and a third via 43 connecting one of the first upper metal interconnections 32 to each of the connection pads 70a and 70b. The first via 41, the second via 42, and the third via 43 may be electrically connected to the first metal interconnection 30a and the connection pads 70a and 70b, and thus the power voltage and/or data provided from the external system may be transmitted to the cell region CR through the connection pads 70a and 70b, the first metal interconnection 30a, and the vias 41, 42, and 43. The first to third vias 41, 42, and 43 may include a conductive metal such as aluminum (Al), copper (Cu), and/or tungsten (W). Although a particular number of vias and metal interconnections have been used as examples, in other embodiments, the number of each may be different.

The decoupling capacitor DC may be provided in the first lower interlayer insulating layer 21a of the peripheral circuit region PR. The decoupling capacitor DC may be electrically connected to the first low metal interconnection 31 through the first via 41. The decoupling capacitor DC may be electrically connected to the source/drain region (not shown) of the first active region ACT1 through a first contact plug 55. The decoupling capacitor DC may include an upper electrode 51, a dielectric layer 52, and a lower electrode 53. The dielectric layer 52 may be disposed between the upper electrode 51 and the lower electrode 53. Each of the upper and lower electrodes 51 and 53 may include at least one of a doped semiconductor material (e.g., doped silicon), a conductive metal nitride (e.g., titanium nitride, tantalum nitride, or tungsten nitride), a metal (e.g., ruthenium, iridium, titanium, or tantalum), or a conductive metal oxide (e.g., iridium oxide). The upper electrode 51 may include the same conductive material as the lower electrode 53 or may include a different conductive material from the lower electrode 53. The dielectric layer 52 may include at least one of an oxide (e.g., silicon oxide), a nitride (e.g., silicon nitride), an oxynitride (e.g., silicon oxynitride), a high-k dielectric material, a ferroelectric material, or the like.

In some embodiments, multiple decoupling capacitors DC may be provided in the peripheral circuit region PR of the semiconductor device 1. When the semiconductor device 1 is operated, the decoupling capacitor DC may filter noise existing in or between operating voltages such as the power voltage and a ground voltage. Thus, the decoupling capacitor DC may improve stability of the operating voltages applied to the semiconductor device 1 even though the semiconductor device 1 is operated at a high speed.

At least one memory element 60 may be provided in the second lower interlayer insulating layer 21b of the cell region CR. The memory element 60 may be electrically connected to the source/drain region (not shown) of the second active region ACT2 through a second contact plug 65. A bit line BL may be disposed between the memory element 60 and the second transistor TR2. The memory element 60 may include a capacitor for the DRAM cell, a phase-change element for the PRAM cell, a variable resistive element for the ReRAM cell, a capacitor for the FeRAM cell, a magnetic element (e.g., a magnetic tunnel junction (MTJ) element) for the MRAM cell, or other type of memory cell. Alternatively, flash memory cells or a logic element may be disposed in the cell region CR.

The connection pads 70a and 70b may be disposed on the first upper interlayer insulating layer 22a of the peripheral circuit region PR. The connection pads 70a and 70b may include a first connection pad 70a and a second connection pad 70b. The first connection pad 70a may vertically overlap with the decoupling capacitor. The second connection pad 70b may not vertically overlap with the decoupling capacitor DC but may be laterally offset from the decoupling capacitor DC. The first connection pad 70a and the second connection pad 70b may be connected to the third vias 43. The connection pads 70a and 70b may include at least one of various metal materials such as copper (Cu), aluminum (Al), nickel (Ni), any alloy thereof, or the like.

The passivation layer 80 may be disposed on the first upper interlayer insulating layer 22a of the peripheral circuit region PR. The passivation layer 80 may have a top surface 80a exposed outside the semiconductor device 1, a first opening 81 exposing the first connection pad 70a, and a second opening 82 exposing the second connection pad 70b. The first opening 81 may have a first width d1, and the second opening 82 may have a second width d2. The first opening 81 may expose a portion of a top surface of the first connection pad 70a, and the second opening 82 may expose a portion of a top surface of the second connection pad 70b. For example, the passivation layer 80 may include polyimide. The passivation layer 80 may protect the first and second connection pads 70a and 70b from external contamination and may prevent an electrical short between the first connection pad 70a and the second connection pad 70b.

The solder bumps 110 and 130 may be disposed on the connection pads 70a and 70b. The solder bumps 110 and 130 may include the first solder bump 110 disposed on the first connection pad 70a and the second solder bump 130 disposed on the second connection pad 70b. The first solder bump 110 may vertically overlap with the decoupling capacitor DC. The second solder bump 130 may not vertically overlap with the decoupling capacitor DC but may be laterally offset from the decoupling capacitor DC. The first solder bump 110 may extend from the top surface of the first connection pad 70a toward the top surface 80a of the passivation layer 80 to cover a portion of the top surface 80a of the passivation layer 80. The first solder bump 110 may be disposed in the first opening 81 of the passivation layer 80 and may fill the first opening 81. The second solder bump 130 may be spaced apart from the passivation layer 80 and may be disposed on the second connection pad 70b. The second solder bump 130 may be provided in the second opening 82 of the passivation layer 80. The power voltage or the ground voltage may be applied to the first solder bump 110, and a data signal may be applied to the second solder bump 130. Accordingly, a circuit formed on the substrate 10, whether in the cell region CR or the peripheral circuit region PR, may be electrically connected to the first solder bump 110 and configured to receive power through a path including the first solder bump 110. In addition, the circuit may be electrically connected to the second solder bump 130 and configured to receive a data signal through a path including the second solder bump 130.

The first solder bump 110 may include a first pillar 112 and a first solder 114, and the second solder bump 130 may include a second pillar 132 and a second solder 134. Each of the first and second pillars 112 and 132 may have a cylindrical shape or other shape. The first pillar 112 may extend from the top surface of the first connection pad 70a toward the top surface 80a of the passivation layer 80 to cover a portion of the top surface 80a of the passivation layer 80. For example, the first and second pillars 112 and 132 may include copper (Cu), and the first and second solders 114 and 134 may include an alloy including at least one of tin (Sn), silver (Ag), copper (Cu), nickel (Ni), bismuth (Bi), indium (In), antimony (Sb), cerium (Ce), or the like. The first pillar 112 may have a third width d3, and the second pillar 132 may have a fourth width d4. The third width d3 may be greater than the fourth width d4. The third width d3 may be greater than the first width d1 of the first opening 81, and the fourth width d4 may be smaller than the second width d2 of the second opening 82.

When the semiconductor device 1 is mounted, pressure may be applied to the first solder bump 110 and the second solder bump 130. Stress may be applied to the decoupling capacitor DC disposed within the semiconductor device 1 by the pressure applied to the first and second solder bumps 110 and 130. According to some embodiments, the first solder bump 110 may be larger than the second solder bump 130, and thus it is possible to reduce or minimize the stress applied to the decoupling capacitor DC vertically overlapping with the first solder bump 110. In addition, since the first solder bump 110 covers a portion of the top surface 80a of the passivation layer 80, the pressure applied to the first solder bump 110 may be dispersed into the passivation layer 80. As a result, it is possible to protect the decoupling capacitor DC vertically overlapping with the first solder bump 110.

Figure 3:
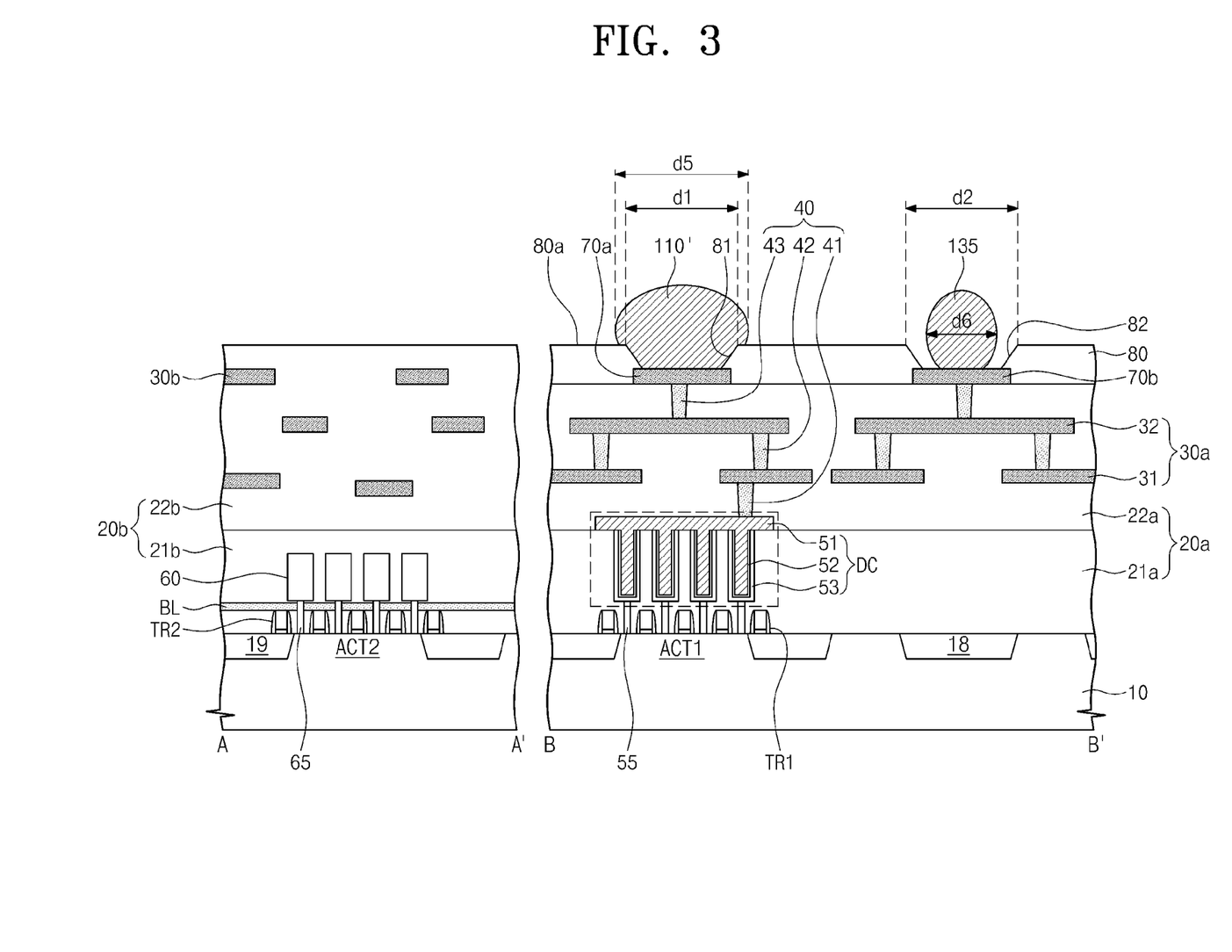
FIG. 3 is a cross-sectional view taken along lines A-A' and B-B' of FIG. 1.

FIG. 3 is a cross-sectional view taken along lines A-A' and B-B' of FIG. 1. Hereinafter, the descriptions to the same elements as in the embodiment of FIG. 2 will be omitted or mentioned briefly for the purpose of ease and convenience in explanation.

Referring to FIGS. 1 and 3, a first solder bump 110' may be disposed on the first connection pad 70a, and a second solder bump 135 may be disposed on the second connection pad 70b. Each of the first and second solder bumps 110' and 135 may be a controlled collapse chip connection (C4) bump. The first solder bump 110' may extend from the top surface of the first connection pad 70a toward the top surface 80a of the passivation layer 80 to cover a portion of the top surface 80a of the passivation layer 80. For example, the first and solder bumps 110' and 135 may include an alloy including at least one of tin (Sn), silver (Ag), copper (Cu), nickel (Ni), bismuth (Bi), indium (In), antimony (Sb), cerium (Ce), or the like.

The maximum width of the first solder bump 110' may be a fifth width d5, and the maximum width of the second solder bump 135 may be a sixth width d6. The fifth width d5 may be greater than the sixth width d6. In addition, the fifth width d5 may be greater than the first width d1 of the first opening 81, and the sixth width d6 may be smaller than the second width d2 of the second opening 82. The first solder bump 110' of which the width is greater than that of the second solder bump 135 may be disposed to vertically overlap with the decoupling capacitor DC, thereby reducing or minimizing the stress applied to the decoupling capacitor DC.

Figure 4:
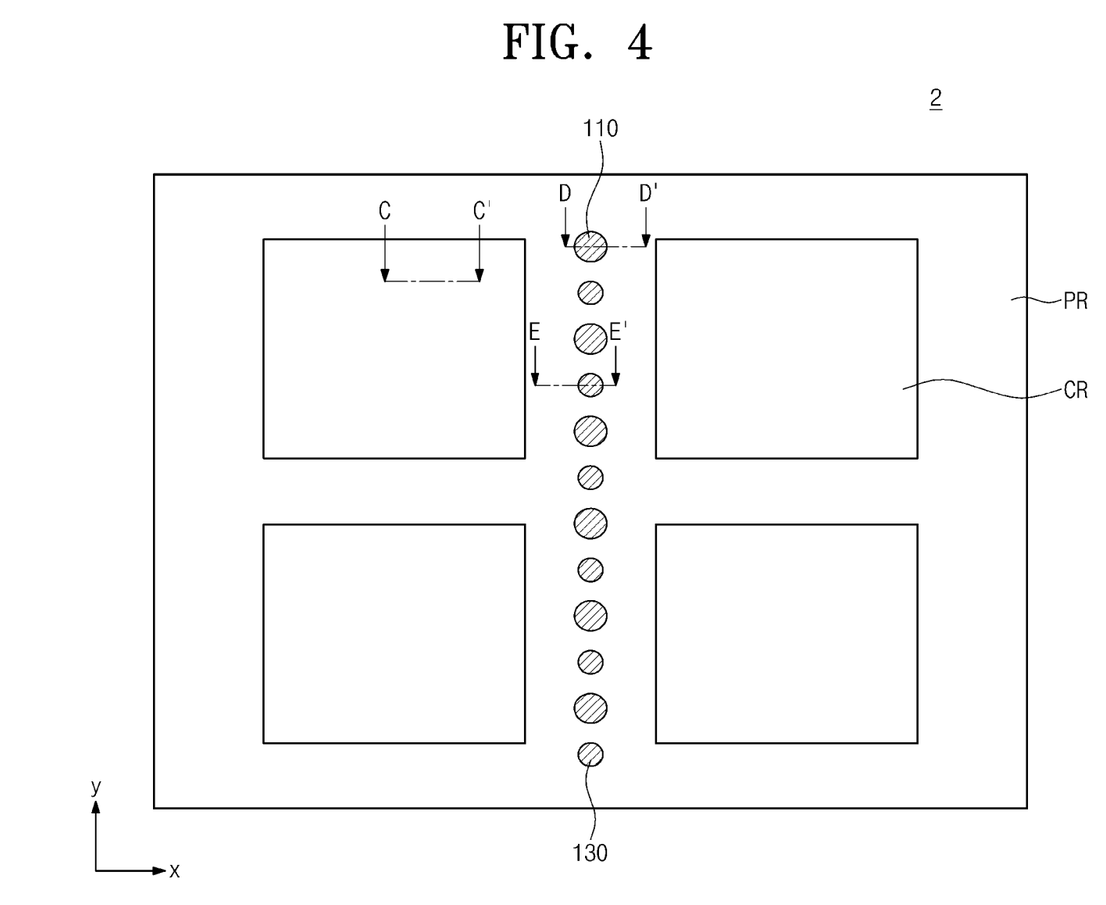
FIG. 4 is a plan view illustrating a semiconductor device according to some embodiments.
Figure 5:
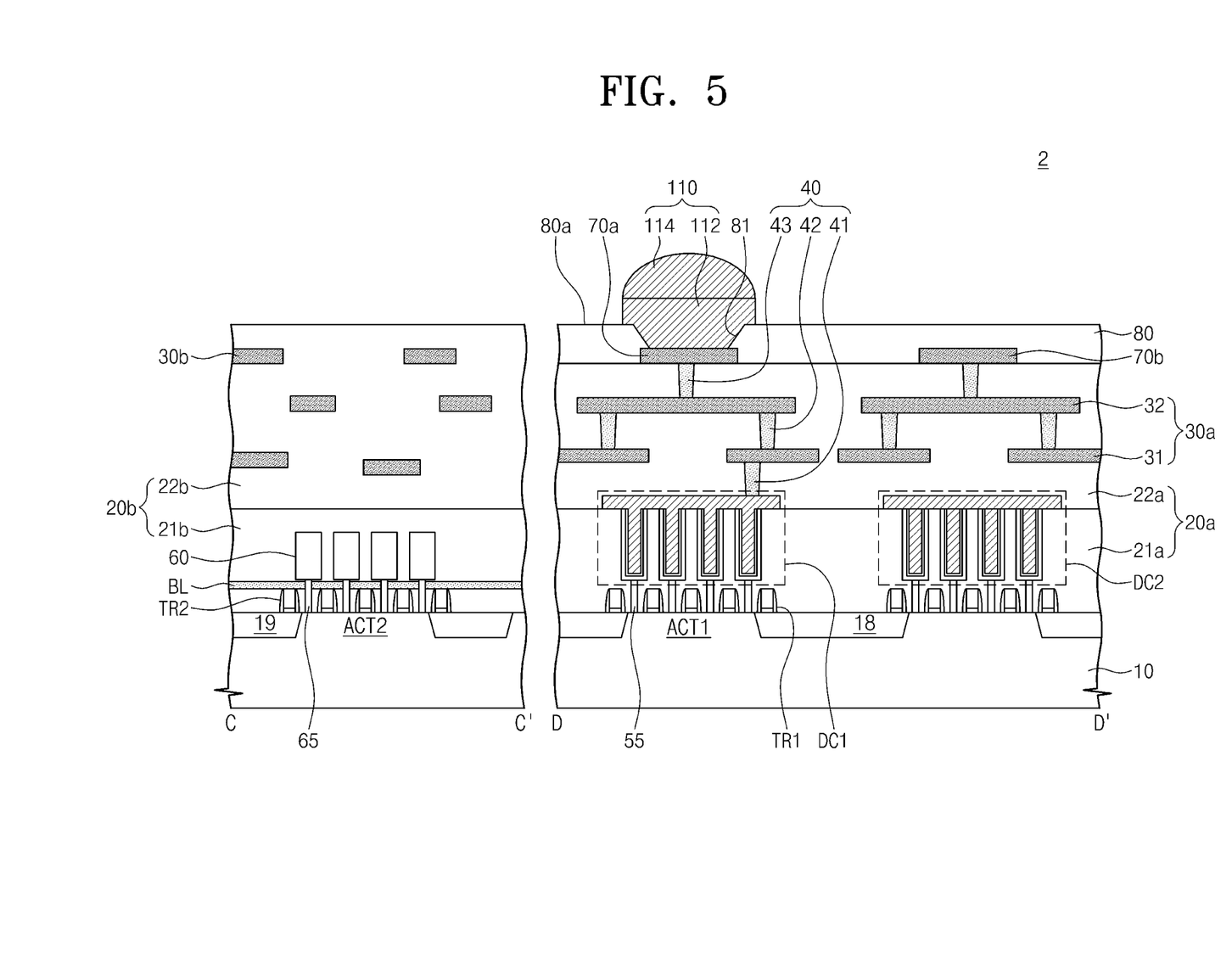
FIG. 5 is a cross-sectional view taken along lines C-C' and D-D' of FIG. 4.
Figure 6:
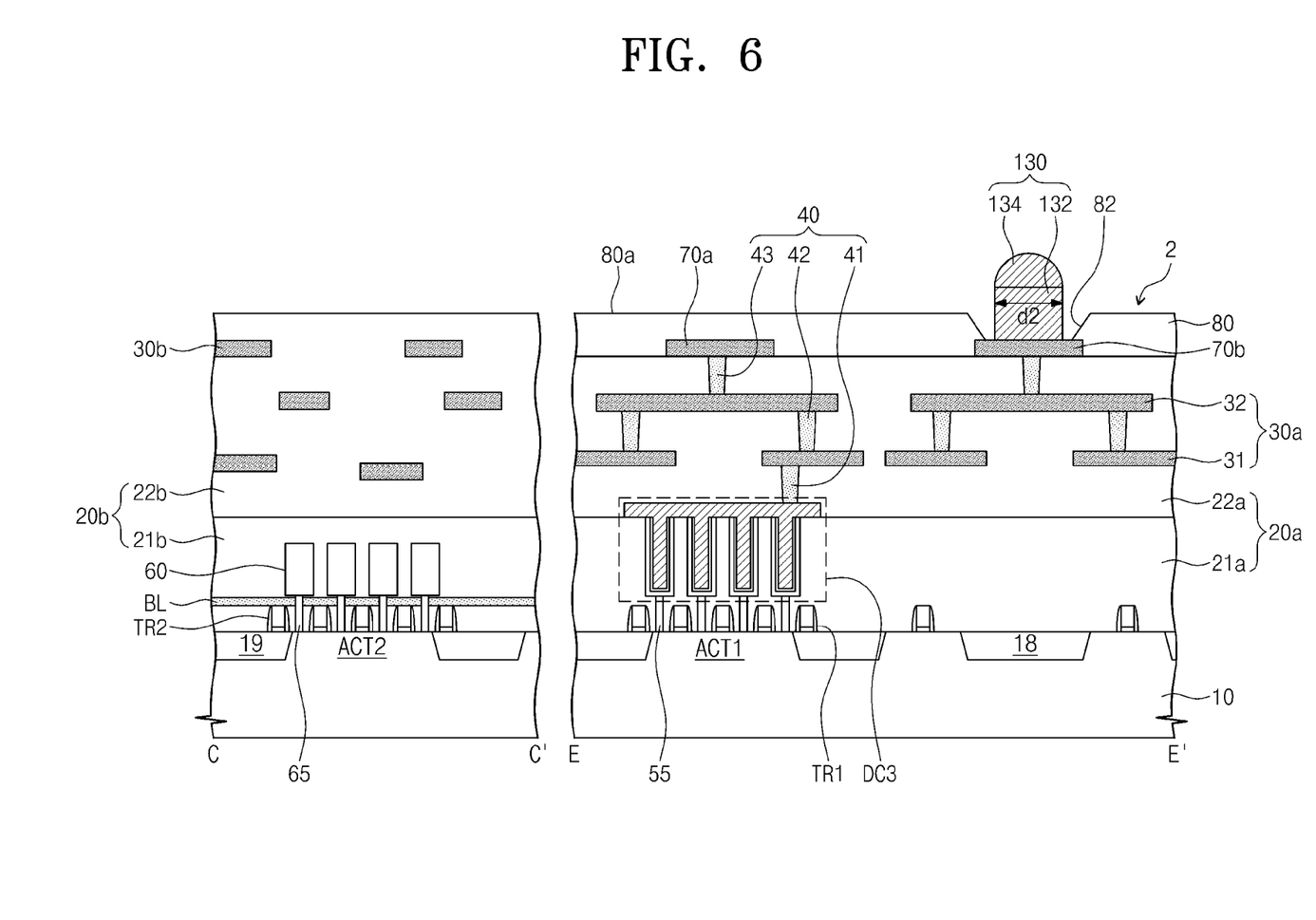
FIG. 6 is a cross-sectional view taken along lines C-C' and E-E' of FIG. 4.

FIG. 4 is a plan view illustrating a semiconductor device according to some embodiments. FIG. 5 is a cross-sectional view taken along lines C-C' and D-D' of FIG. 4, and FIG. 6 is a cross-sectional view taken along lines C-C' and E-E' of FIG. 4. Hereinafter, the descriptions to the same elements as in the embodiment of FIGS. 1 and 2 will be omitted or mentioned briefly for the purpose of ease and convenience in explanation.

Referring to FIGS. 4 to 6, a semiconductor device 2 may include a first cross section (i.e., a cross section taken along the line D-D') in which a first solder bump 110 is provided, and a second cross section (i.e., a cross section taken along the line E-E) in which a second solder bump 130 is provided. The first solder bump 110 and the second solder bump 130 may be arranged to constitute one column in the peripheral circuit region PR. Multiple first solder bumps 110 and multiple second solder bumps 130 may be included. The first solder bumps 110 and the second solder bumps 130 may be spaced apart from each other and may be alternately arranged along the second direction y. A power voltage or a ground voltage may be applied to the first solder bump 110, and a data signal may be applied to the second solder bump 130.

In FIG. 5 illustrating the first cross section (taken along the line D-D'), the semiconductor device 2 may include a first decoupling capacitor DC1 vertically overlapping with the first solder bump 110 and a second decoupling capacitor DC2 not vertically overlapping with the first solder bump 110. The second decoupling capacitor DC2 may be laterally offset from the first solder bump 110. In FIG. 6 illustrating the second cross section (taken along the line E-E'), the semiconductor device 2 may include a third decoupling capacitor DC3 that does not vertically overlap with the second solder bump 130 but is laterally offset from the second solder bump 130.

According to some embodiments, the semiconductor device 2 may include the second decoupling capacitor DC2 laterally offset from the first solder bump 110 as well as the first decoupling capacitor DC1 disposed under the first solder bump 110. In other words, multiple decoupling capacitors may be disposed in the peripheral circuit region PR having a limited area, and thus it is possible to effectively filter noise generated when operating voltages (e.g., power and ground voltages) are applied. As a result, stability of the operating voltages applied to the semiconductor device 2 may be improved by the decoupling capacitors DC1, DC2, and DC3 even though the semiconductor device 2 is operated at a high speed.

Although solder bumps 110 having the structure described with respect to FIG. 2 have been described as being included in the semiconductor device 2, in other embodiments, solder bumps 110' having the structure described with respect to FIG. 3 may be used. Similarly, in some embodiments the solder bumps 135 having the structure described with respect to FIG. 3 may be included in the semiconductor device 2.

Figure 7:
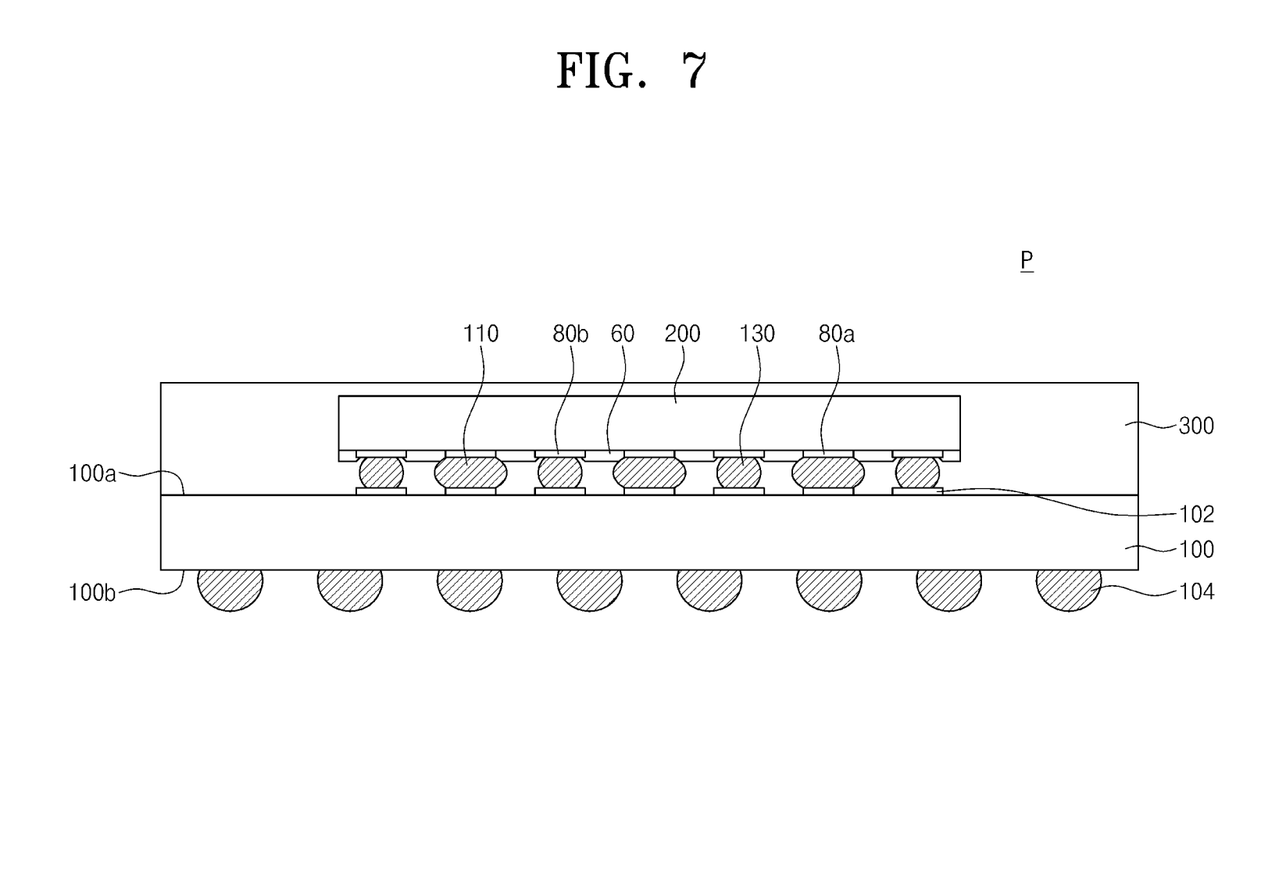
FIG. 7 is a cross-sectional view illustrating a semiconductor package according to some embodiments.

FIG. 7 is a cross-sectional view illustrating a semiconductor package according to some embodiments. FIG. 7 illustrates a semiconductor package including the semiconductor device according to some embodiments. Referring to FIG. 7, a semiconductor package P may include a package substrate 100, a semiconductor chip 200, and a mold layer 300.

The package substrate 100 may be a printed circuit board (PCB), or other substrate on which a semiconductor chip 200 may be mounted, that has a top surface 100a and a bottom surface 100b opposite to the top surface 100a. At least one substrate pad 102 may be disposed on the top surface 100a of the package substrate 100, and at least one external terminal 104 may be disposed on the bottom surface 100b of the package substrate 100. For example, the external terminal 104 may be a solder ball. For example, the external terminal 104 may include an alloy including at least one of tin (Sn), silver (Ag), copper (Cu), nickel (Ni), bismuth (Bi), indium (In), antimony (Sb), cerium (Ce), or the like.

The semiconductor chip 200 may be mounted on the top surface 100a of the package substrate 100 through first and second solder bumps 110 and 130. For example, the semiconductor chip 200 may be one of the semiconductor devices 1 and 2 of FIGS. 1 to 6 according to various embodiments. The semiconductor chip 200 may be a logic chip, a memory chip, or a combination thereof. A size of the first solder bump 110 may be larger than that of the second solder bump 130. A power voltage may be applied to the first solder bump 110, and a data signal may be applied to the second solder bump 130.

The mold layer 300 may cover the top surface 100a of the package substrate 100 and the semiconductor chip 200. The mold layer 300 may include an insulating polymer material such as an epoxy molding compound (EMC).

Since the size of the first solder bump 110 is greater than that of the second solder bump 130, it is possible to reduce or minimize stress that is applied to the decoupling capacitor included in the semiconductor chip 200 when the semiconductor chip 200 is mounted on the package substrate 100. As a result, elements included in the semiconductor chip 200 may be protected.

However, embodiments are not limited to the arrangements and the number of the first and second solder bumps 110 and 130 described in the above embodiments. In addition, the structure of the cell region CR may be variously modified.

According to some embodiments, the solder bump lager than another solder bump may be provided on the connection pad vertically overlapping with the decoupling capacitor, thereby reducing or minimizing the stress applied to the decoupling capacitor.

According to some embodiments, the passivation layer may be provided on the connection pad vertically overlapping with the decoupling capacitor, and the solder bump may cover the connection pad and a portion of the passivation layer. Thus, the stress applied to the solder bump may be dispersed in the passivation layer.

While embodiments have been described with reference to particular embodiments, it will be apparent to those skilled in the art that various changes and modifications may be made without departing from the spirits and scopes. Therefore, it should be understood that the above described particular embodiments are not limiting, but illustrative. Thus, the scopes are to be determined by the broadest permissible interpretation of the following claims and their equivalents, and shall not be restricted or limited by the foregoing description.

What is claimed is:

1. A semiconductor device comprising:
   a substrate;
   a decoupling capacitor disposed on the substrate;
   a first connection pad vertically overlapping with the decoupling capacitor;
   a passivation layer having a first opening exposing a portion of the first connection pad through the first opening; and
   a first solder bump disposed on the first connection pad and covering a portion of a top surface of the passivation layer,
   wherein the first solder bump fills the first opening and is in contact with the passivation layer.

2. The semiconductor device of claim 1, further comprising:
   a circuit formed on the substrate,
   wherein the first solder bump and the first connection pad are part of a power or ground path electrically connected to the circuit.

3. The semiconductor device of claim 1, wherein:
   the portion of the first connection pad is part of a top surface of the first connection pad; and
   the first solder bump substantially completely covers the exposed portion of the first connection pad.

4. The semiconductor device of claim 3,
   wherein the first solder bump extends from the first connection pad over the top surface of the passivation layer.

5. The semiconductor device of claim 3, wherein:
   the first opening has a first width along a direction; and
   a width of the first solder bump along the direction is greater than the first width.

6. The semiconductor device of claim 1, further comprising:
   a second connection pad laterally offset from the decoupling capacitor; and a second solder bump disposed on the second connection pad.

7. The semiconductor device of claim 6, wherein a width of the first solder bump is greater than a width of the second solder bump.

8. The semiconductor device of claim 7, wherein the second solder bump is vertically offset from any decoupling capacitor formed on the substrate.

9. The semiconductor device of claim 1, wherein the first connection pad is electrically connected to the decoupling capacitor.

10. The semiconductor device of claim 1, wherein:
the first solder bump comprises a pillar and solder; and
the pillar contacts the top surface of the passivation layer.

11. A semiconductor device comprising:
a substrate;
a decoupling capacitor disposed on the substrate;
a passivation layer having a first opening exposing a first connection pad;
a first solder bump vertically overlapping with the decoupling capacitor,
wherein the first solder bump fills the first opening and is in contact with the passivation layer; and
a second solder bump offset from the decoupling capacitor,
wherein a width of the first solder bump is greater than a width of the second solder bump.

12. The semiconductor device of claim 11, further comprising:
a circuit disposed on the substrate;
wherein:
the first solder bump is part of a power or ground path electrically connected to the circuit; and
the second solder bump is part of a signal path electrically connected to the circuit.

13. The semiconductor device of claim 11, wherein:
the substrate includes a cell region and a peripheral circuit region;
the decoupling capacitor is formed in the peripheral circuit region; and
the semiconductor device further comprises a memory element disposed on the substrate in the cell region.

14. The semiconductor device of claim 11, wherein:
the first opening has a first width along a direction;
the first solder bump extends from the first connection pad over a top surface of the passivation layer; and
a width of the first solder bump along the direction is greater than the first width.

15. The semiconductor device of claim 11, wherein:
the passivation layer includes a second opening exposing a second connection pad; and
the second solder bump is provided in the second opening on the second connection pad and is spaced apart from the passivation layer.

16. The semiconductor device of claim 11, wherein the first solder bump and the decoupling capacitor are electrically connected to each other through metal interconnections.

17. A semiconductor package, comprising:
a package substrate;
a semiconductor chip including a decoupling capacitor and a passivation layer, wherein the passivation layer includes a first opening and a second opening;
a plurality of solder bumps electrically connecting the semiconductor chip to the package substrate;
wherein the plurality of solder bumps includes
a first solder bump disposed in the first opening and vertically aligned with the decoupling capacitor, the first solder bump extending over the passivation layer; and
a second solder bump disposed in the second opening, and non-overlapped vertically with a sidewall of the second opening of the passivation layer and the decoupling capacitor.

18. The semiconductor package of claim 17, wherein the second solder bump is vertically offset from any decoupling capacitor of the semiconductor chip.

19. The semiconductor package of claim 17, wherein a width of the first solder bump is greater than a width of the second solder bump.

* * * * *